(12) United States Patent
Yamamoto (10) Patent No.: US 7,733,192 B2
(45) Date of Patent: Jun. 8, 2010

(54) VOLTAGE CONTROLLED OSCILLATOR (75) Inventor: Ryota Yamamoto, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 109 days.

(21) Appl. No.: 12/222,585

(22) Filed: Aug. 12, 2008

(65) Prior Publication Data

US 2009/0051454 A1 Feb. 26, 2009

(30) Foreign Application Priority Data

Aug. 22, 2007 (JP) ............................. 2007-215776

(51) Int. Cl.
*H03B 5/00* (2006.01)
*H03L 7/099* (2006.01)
(52) U.S. Cl. ..................................... 331/177 R; 331/34
(58) Field of Classification Search .................. 331/34, 331/57, 175, 177 R
See application file for complete search history.

(56) References Cited

U.S. PATENT DOCUMENTS 5,334,951 A * 8/1994 Hogeboom .................. 331/1 A

FOREIGN PATENT DOCUMENTS

| JP | 7-183743 | 7/1995 |
| JP | 2002-76787 | 3/2002 |
| JP | 2004-274569 | 9/2004 |

* cited by examiner

*Primary Examiner*—David Mis
(74) *Attorney, Agent, or Firm*—McGinn IP Law Group, PLLC (57) ABSTRACT

According to one aspect of the present invention, there is provided a voltage controlled oscillator controlling frequency of an output signal according to input voltage, the voltage controlled oscillator including a current controlled oscillator setting the frequency of the output signal based on control current, and a voltage-current converter including a transistor controlling a current amount of the control current according to the input voltage, in which the voltage-current converter is supplied with control voltage, and threshold value voltage of the transistor is controlled according to the control voltage.

10 Claims, 7 Drawing Sheets

VOLTAGE CONTROLLED OSCILLATOR

BACKGROUND OF THE INVENTION

1. Field of the Invention

The present invention relates to a voltage controlled oscillator, and more particularly, to a voltage controlled oscillator including a voltage-current converter outputting current according to input voltage and a current controlled oscillator controlling frequency of an output signal according to input current.

2. Description of Related Art

One of oscillators used for a semiconductor device includes a voltage controlled oscillator. The voltage controlled oscillator is used for an output part of a PLL (Phase Locked Loop), for example. The voltage controlled oscillator varies frequency of an output signal according to input voltage. At this time, the voltage controlled oscillator varies the frequency of the output signal in a predetermined range with respect to an input voltage range. One example of the voltage controlled oscillator is shown in FIG. 8.

Figure 8:
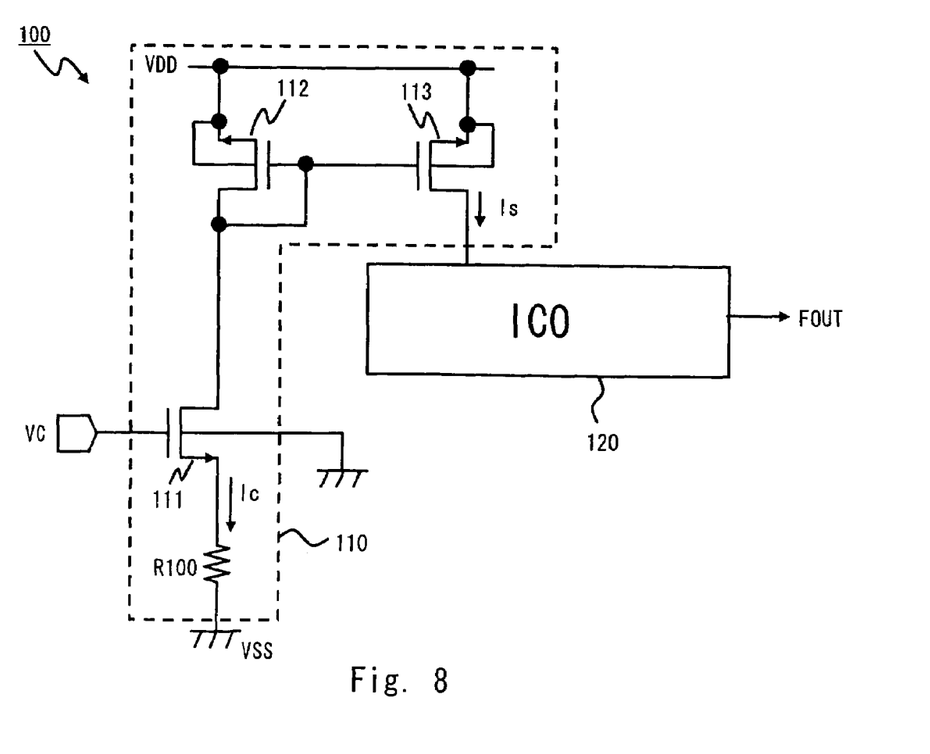
FIG. 8 is a schematic diagram of a typical voltage controlled oscillator.

A voltage controlled oscillator 100 shown in FIG. 8 includes a voltage-current converter 110 and a current controlled oscillator 120. In the voltage controlled oscillator 100, the voltage-current converter 110 generates control current Is according to input voltage VC. The control current Is is input to the current controlled oscillator 120. The current controlled oscillator 120 controls frequency of an output signal FOUT according to a magnitude of the control current Is.

Figure 9:
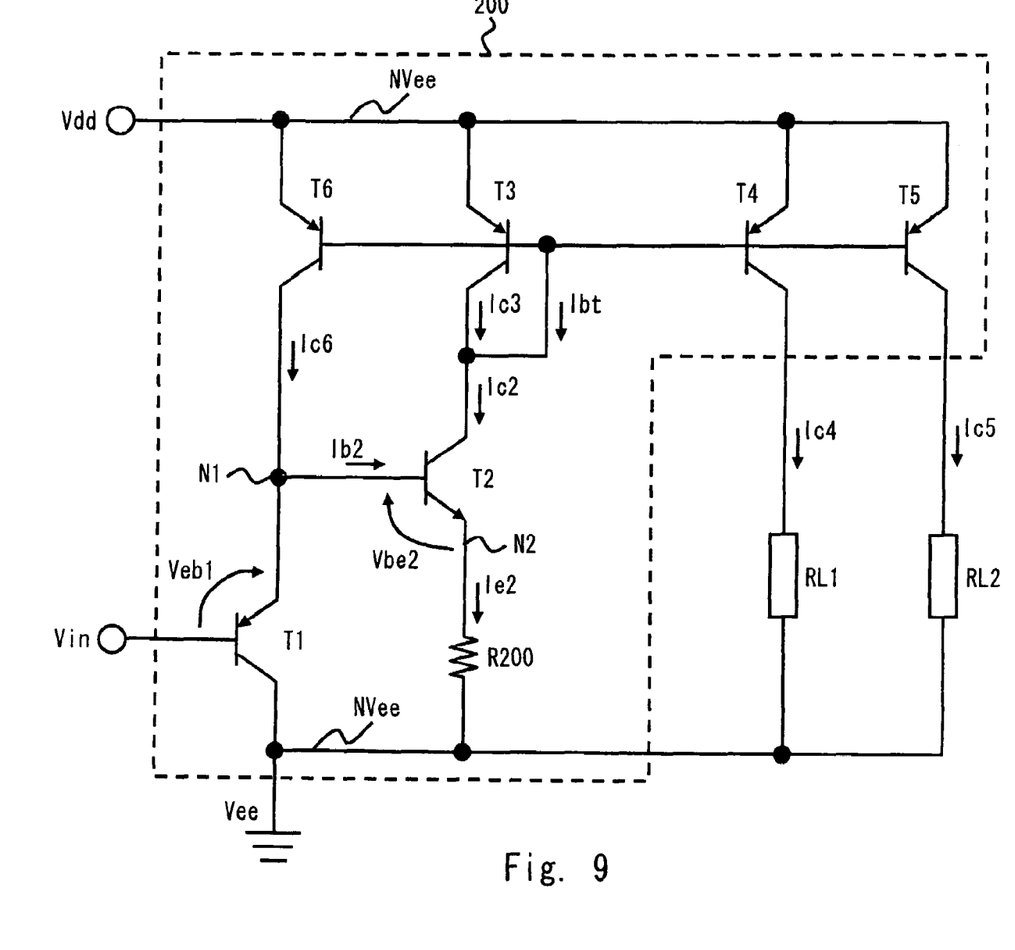
FIG. 9 is a circuit diagram of a voltage-current converter disclosed in Japanese Unexamined Patent Application Publication No. 2004-274569.

As stated above, in the voltage controlled oscillator, the voltage-current converter converts input voltage into current, and the frequency of the output signal FOUT is controlled based on the converted current. The voltage-current converter is also used in an application other than the voltage controlled oscillator. One example of the voltage-current converter is disclosed in Japanese Unexamined Patent Application Publication No. 2004-274569. FIG. 9 shows a circuit diagram of a voltage-current converter 200 disclosed in Japanese Unexamined Patent Application Publication No. 2004-274569. The voltage-current converter 200 generates current Ie2 by a resistor R200 based on a voltage value of input voltage Vin. The generated current Ie2 is supplied to loads RL1 and RL2 as current Ic4 and Ic5 through a current mirror formed by transistors T3 and T4.

Further, a voltage-current converter in which a differential signal functions as an input signal and current is generated based on a difference of signal levels between two signals forming the differential signal is disclosed in Japanese Unexamined Patent Application Publication Nos. 2002-76787 and 7-183743.

Figure 10:
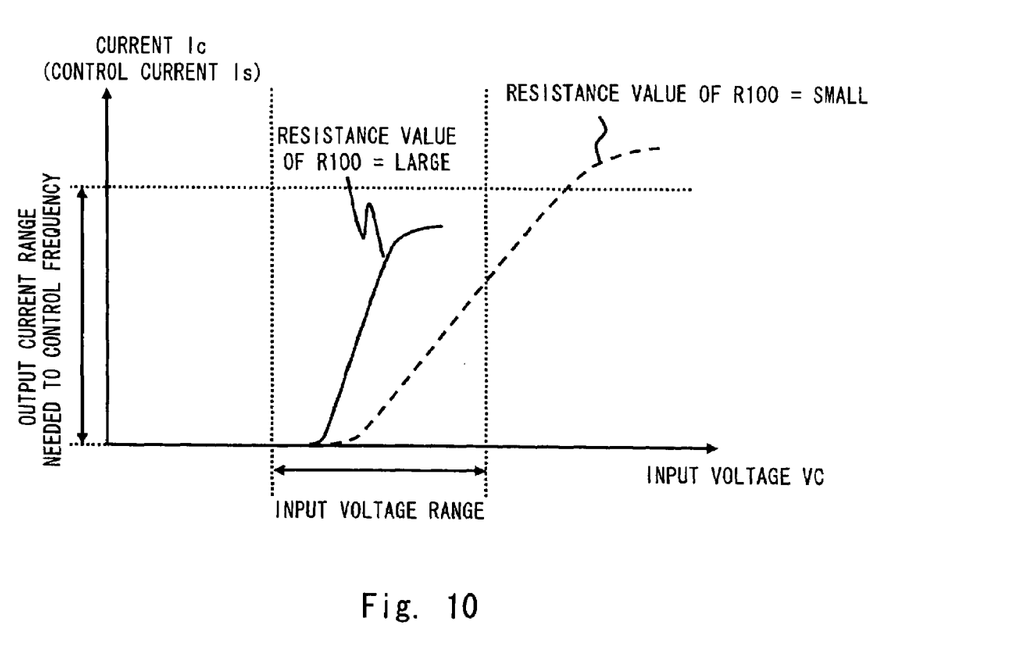
FIG. 10 is a graph showing a voltage-current characteristics of a voltage-current converter of a typical voltage controlled oscillator.

However, we have now discovered that the voltage-current converter shown in FIGS. 8 and 9 cannot secure enough output current range if the input voltage range is limited. Now, the relation between the input voltage and the output current in the voltage-current converter 110 will be described with reference to FIG. 10. The voltage-current converter 110 determines an inclination of the output current and a maximum value of the output current with respect to the variation of the input voltage according to a resistance value of a resistor R100. Therefore, when the resistance value of the resistor R100 varies, there may be some cases in which the output current range cannot be secured enough with respect to the input voltage range. In the example shown in FIG. 10, when the resistance value of the resistor R100 increases, the output current is saturated in a current value equal to or smaller than the maximum value of the output current range needed to control the frequency even when the input voltage is in the input voltage range. Further, when the resistance value of the resistor R100 decreases, the output current cannot secure the output current range needed to control the frequency even when the input voltage reaches the maximum value of the input voltage range. Since the value of the output current depends on the resistor R200 also in the voltage-current converter 200 shown in FIG. 9, the problem shown in FIG. 10 occurs as well.

As disclosed in Japanese Unexamined Patent Application Publication Nos. 2002-76787 and 7-183743, the voltage-current converter in which the differential signal functions as the input signal controls the inclination of the change of the output current by giving fluctuation reflecting the difference of the signal level of the differential signal to the reference current. However, when the value of the reference current varies, the value of the output current varies even with the constant variance rate of the output current. There is caused a problem that enough output current range cannot be secured with respect to the input voltage range if such a variation is caused when the input voltage range is limited.

When the voltage-current converter in which enough output current range with respect to the input voltage range cannot be secured is used as the voltage controlled oscillator, it is impossible to secure the enough frequency variable range with respect to the input voltage range. In the recent semiconductor device which is operated in a low voltage, the input voltage range cannot be made wide. Hence, the problem that enough output current range with respect to the input voltage range cannot be secured obviously influences the frequency variable range of the voltage controlled oscillator.

SUMMARY

According to one aspect of the present invention, there is provided a voltage controlled oscillator controlling frequency of an output signal according to input voltage, the voltage controlled oscillator including a current controlled oscillator setting the frequency of the output signal based on control current, and a voltage-current converter including a transistor controlling a current amount of the control current according to the input voltage, in which the voltage-current converter is supplied with control voltage, and threshold value voltage of the transistor is controlled according to the control voltage.

According to the voltage controlled oscillator of the present invention, the threshold value voltage of the transistor of the voltage-current converter is controlled according to the control voltage. Accordingly, the output range of the control current output from the transistor can be controlled according to the input voltage. In summary, in the voltage-current converter of the present invention, it is possible to adjust the relation between the input voltage range and the output current range by the control voltage. Hence, the voltage controlled oscillator according to the present invention is able to secure the enough frequency variable range with respect to the input voltage range even with the limited input voltage range.

The voltage controlled oscillator according to the present invention is able to secure the enough frequency variable range with respect to the limited input voltage range.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
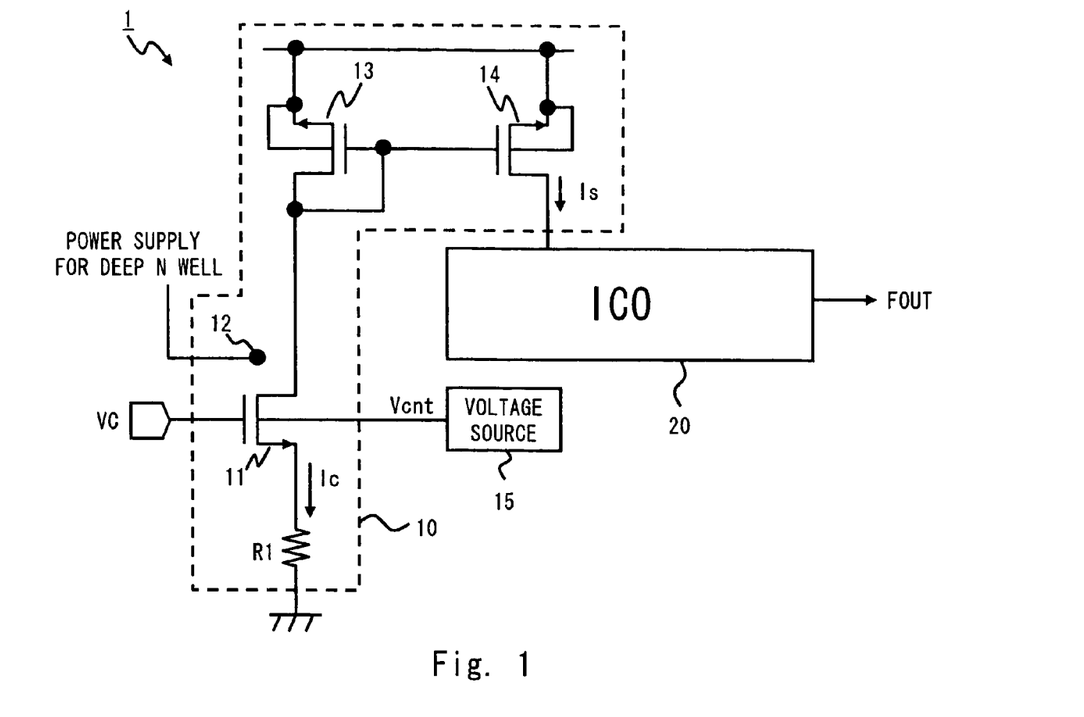
FIG. 1 is a schematic diagram of a voltage controlled oscillator according to a first embodiment.

The embodiments of the present invention will now be described hereinafter in detail with reference to the drawings. FIG. 1 shows a schematic diagram of a voltage controlled oscillator 1 according to the present embodiment. As shown in FIG. 1, the voltage controlled oscillator 1 includes a voltage-current converter 10, a voltage source 15, and a current controlled oscillator 20.

The voltage-current converter 10 controls a current amount of control current Is according to input voltage VC and controls an output current range of the control current Is with respect to an input voltage range according to control voltage Vcnt. The voltage-current converter 10 includes a transistor (input transistor, for example) 11, a current setting resistor (resistor, for example) R1, and PMOS transistors 13 and 14. The voltage-current converter 10 supplies current Ic generated by the input transistor 11 and the resistor R1 as the control current Is to the current controlled oscillator 20 through a current mirror formed by the PMOS transistors 13 and 14.

The resistor R1 has one end connected to a first power supply (ground node VSS). The input transistor is formed by an NMOS transistor, for example. The input transistor has a gate to which input voltage VC is input, a source to which the other end of the resistor R1 is connected, a back gate terminal supplying well potential to which control voltage Vcnt is input, and a drain to which a drain of the PMOS transistor 13 is connected. The input transistor 11 includes a deep well terminal 12, and supplies potential to the deep N well through the deep well terminal 12. The deep N well will be described later in detail.

The PMOS transistor 13 has a drain and a gate connected with each other. A source of the PMOS transistor 13 is connected to a second power supply (power supply node VDD). A back gate terminal supplying potential to a well region of the PMOS transistor 13 is connected to a power supply node VDD. Further, the drain of the PMOS transistor 13 is connected to a drain of the input transistor 11. A gate of the PMOS transistor 14 is connected to the gate of the PMOS transistor 13. A source of the PMOS transistor 14 is connected to the power supply node VDD. A back gate terminal supplying potential to a well region of the PMOS transistor 14 is connected to the power supply node VDD. A drain of the PMOS transistor 14 is connected to an internal circuit of the current controlled oscillator 20. Current Ic generated by the input transistor 11 and the resistor R1 is supplied to the drain of the PMOS transistor 13, and the control current Is reflecting the current Ic is output from the drain of the PMOS transistor 14. In the following description, a current amount of the control current Is is assumed to be the same as that of the current Ic.

The voltage source 15 outputs the predetermined voltage as the control voltage Vcnt. The control voltage Vcnt is determined by a result of simulating variation of the control current Is at a design stage, for example. A method of determining the control voltage Vcnt will be described later in detail.

The current controlled oscillator 20 controls the frequency of the output signal FOUT according to the current amount of the control current Is. For example, when the current amount of the control current Is is large, then the frequency of the output signal FOUT is made high, and when the current amount of the control current Is is small, then the frequency of the output signal FOUT is made low. Note that the frequency of the output signal FOUT that can be controlled by the current controlled oscillator 20 has an upper limit and a lower limit, and variable range of the frequency is called frequency variable range.

Now, the characteristic of the input transistor 11 will be described. In the present embodiment, an NMOS transistor is employed as the input transistor 11. The NMOS transistor flows a large amount of current from the drain to the source if the gate voltage is high, and flows a small amount of current from the drain to the source if the gate voltage is low. Further, in the NMOS transistor, when the gate voltage is equal to or less than the threshold value voltage Vt, the connection between the drain and the source is disconnected. The threshold value voltage Vt can be obtained based on the following expression (1):

$$Vt = V_{fb} + 2\phi_B + \frac{\sqrt{2\varepsilon_{si}qN_a(2\phi_B + Vs - Vsub)}}{C_{ox}} \quad (1)$$

where Vsub is voltage of the well region (hereinafter referred to as back gate voltage Vsub), Vs is source voltage, $V_{fb}$ is flat band voltage, $\Phi_B$ is a difference between Fermi level and true level, $\varepsilon_{si}$ is a conductivity of a silicon, $N_a$ is a density of an acceptor, q is a charge amount, and $C_{ox}$ is a unit capacity of a gate oxide film. It can be understood from the expression (1) that the threshold value voltage Vt can be changed by the voltage of the back gate voltage Vsub.

In the present embodiment, the control voltage Vcnt output from the voltage source 15 is input as the back gate voltage Vsub. The region same to a substrate region P-sub is typically used as the well region of the NMOS transistor. The ground voltage is typically supplied to the substrate region. P-sub.

Figure 2:
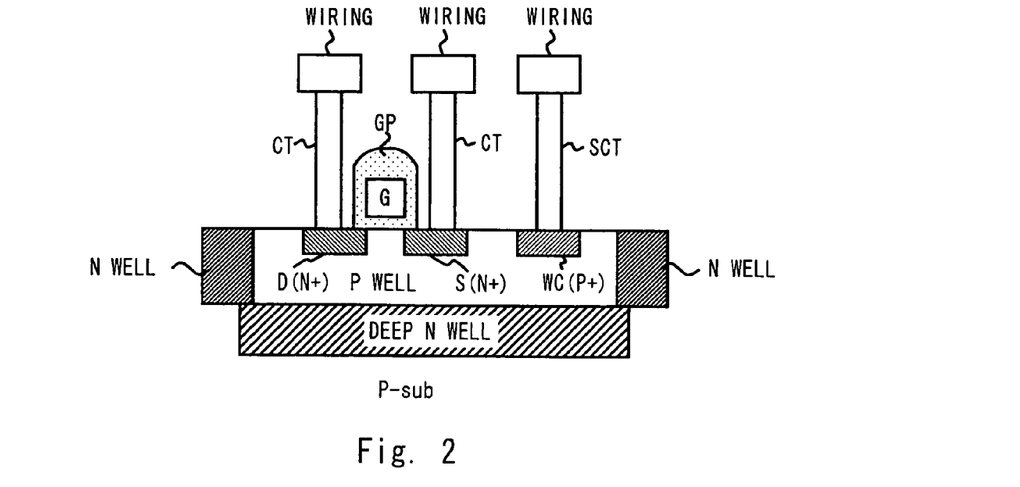
FIG. 2 is a cross sectional view of an input transistor according to the first embodiment.

However, in the input transistor 11 in the present embodiment, the control voltage Vcnt different from the ground voltage is input to the well region. Accordingly, in the present embodiment, the substrate region P-sub is isolated from the well region of the transistor using the deep N well layer. FIG. 2 shows an example of a cross sectional view of the input transistor 11.

As shown in FIG. 2, the input transistor 11 includes a deep N well layer formed by an N-type semiconductor in an upper layer of the substrate region P-sub formed by the P-type semiconductor. Then a P-well region (well region of the input transistor) is formed by the P-type semiconductor in an upper layer of the deep N well layer. A source S and a drain D are formed by the N-type semiconductor and a well contact WC is formed by the P-type semiconductor around a surface of the P-well region. Further, a gate G is formed to straddle the source S and the drain D. Note that the gate G is covered with a gate protective film GP. Further, N-well regions are formed in side surfaces of the P-well region of the input transistor 11 in order to separate elements. The source S and the drain D are connected to the wirings in the upper layer through the contacts CT. The well contact WC is connected to the wiring in the upper layer through a sub contact SCT. The input transistor 11 is formed as the deep N well structure so as to be able to control the back gate voltage independently from the voltage of the substrate region P-sub.

Figure 3:
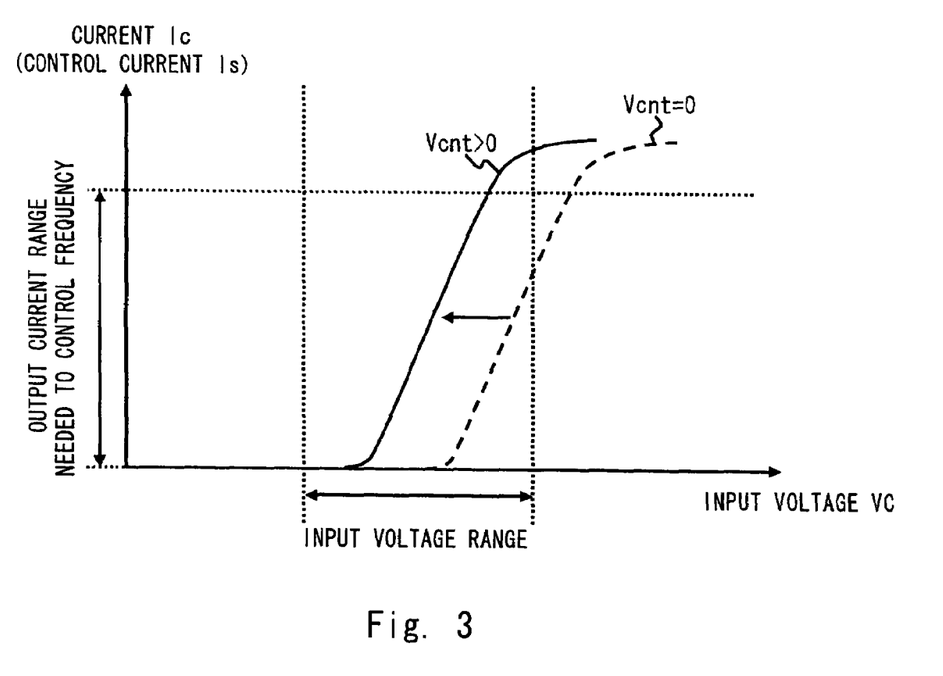
FIG. 3 is a graph showing a voltage-current characteristics of a voltage-current converter according to the first embodiment.

Now, the voltage-current characteristics of the voltage-current converter 10 will be described. FIG. 3 shows a graph of the voltage-current characteristics of the voltage-current converter 10. As shown in FIG. 3, the control current Is starts to be output when the input voltage VC becomes equal to or larger than the threshold value voltage Vt, and increases as the input voltage VC increases. At this time, an inclination of the control current Is is determined by a resistance value of the resistor R1. Further, the control current Is increases as the input voltage VC increases and is saturated at a predetermined current value. The current value at which the control current Is is saturated is also determined by the resistance value of the resistor R1. The input transistor 11 has a ground node VSS side connected to the resistor R1, and therefore the source voltage Vs of the input transistor 11 increases as the control current Is increases. Since the input transistor 11 cannot flow further current when the voltage difference between the source and the drain of the input transistor 11 decreases, there is caused the saturation of the control current Is.

Further, the threshold value voltage Vt of the input transistor 11 decreases as the voltage of the control voltage Vcnt increases. In the example shown in FIG. 3, the threshold value voltage Vt of the input transistor 11 is high when the control voltage Vcnt is at ground voltage (=0V). Even if the input voltage VC reaches the maximum value of the input voltage range, the current amount of the control current Is does not reach the upper limit of the output current range needed to control the frequency of the current controlled oscillator 20. On the other hand, when the control voltage Vcnt is set higher than the ground voltage, the threshold value voltage Vt of the input transistor 11 becomes lower than the case where the control voltage Vcnt is the ground voltage. By shifting the threshold value voltage Vt as described above, it is possible to control the current amount of the control current Is to obtain the output current range needed to control the frequency of the current controlled oscillator 20 with respect to the input voltage range of the input voltage VC.

Now, a method of setting the voltage value of the control voltage Vcnt will be described. As stated above, in the present embodiment, it is possible to shift the output characteristic curve of the control current Is by the voltage value of the control voltage Vcnt. In the semiconductor device, the resistance value of the resistor R1 and the threshold value voltage Vt of the input transistor 11 may vary depending on the manufacturing condition. Accordingly, in the present embodiment, a simulation is performed in consideration of this variation at the design stage so as to set the voltage value of the control voltage Vcnt. To be more specific, an optimal value of the control voltage Vcnt is set so that the current value of the control current Is can secure the output current range needed to control the frequency while keeping a state where the input voltage VC is in the input voltage range even when the variation is caused.

As will be clear from the above description, in the voltage-current converter 10 in the present embodiment, the threshold value voltage Vt of the input transistor 11 is changed by the control voltage Vcnt so as to shift the output characteristics of the control current Is. In other words, the voltage-current converter 10 controls the output current range of the control current Is with respect to the input voltage range by the control voltage Vcnt. Accordingly, the voltage-current converter 10 is able to secure the output current range of the control current Is having enough width with respect to the input voltage range irrespective of the magnitude of the threshold value voltage Vt of the input transistor 11. In summary, even with the limited input voltage range, the voltage-current converter 10 is able to output the control current Is which satisfies the input current range of the control current Is required by the current controlled oscillator 20. Hence, it is made possible for the voltage controlled oscillator 1 to secure the frequency variable range having enough width with respect to the input voltage range.

Further, in the present embodiment, the simulation or the like is previously performed in consideration of the variation so as to set the voltage value of the control voltage Vcnt. Accordingly, even when the variation of the control current Is due to the manufacturing condition is caused, it is possible to secure the output current range of the control current Is satisfying the input voltage range.

The voltage controlled oscillator 1 according to the present embodiment is particularly effective when the power supply voltage is low. In the voltage controlled oscillator driven in low voltage, the variation range of the input voltage VC cannot be set to a wide range. By applying the voltage-current converter 10 according to the present embodiment, it is made possible to realize the wide frequency variable range even with the voltage controlled oscillator driven in low voltage with the limited input voltage range. Further, it is possible to reduce power consumption of the voltage controlled oscillator by activating the voltage controlled oscillator at low power supply voltage.

Second Embodiment

Figure 4:
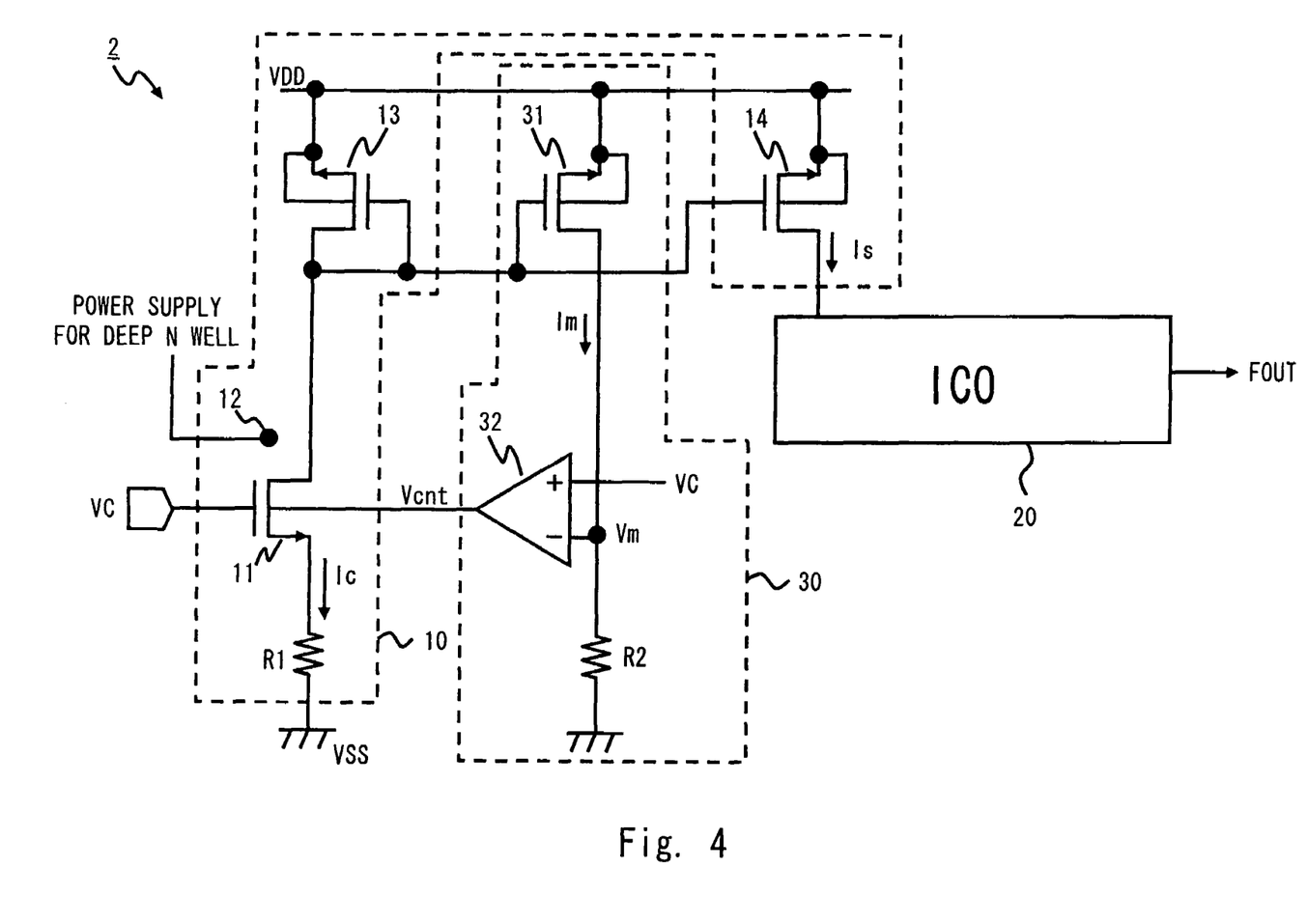
FIG. 4 is a schematic diagram of a voltage controlled oscillator according to a second embodiment.

FIG. 4 shows a schematic diagram of a voltage controlled oscillator 2 according to the second embodiment. As shown in FIG. 4, in the voltage controlled oscillator 2, a control voltage generator 30 is added to the voltage controlled oscillator 1 according to the first embodiment. The control voltage generator 30 generates the control voltage Vcnt according to the current value of the current Ic (or control current Is) generated at the input transistor 11. The control voltage generator 30 includes a PMOS transistor 31, an amplifier 32, and a resistor R2.

The PMOS transistor 31 has a source connected to a power supply node VDD, a drain connected to a ground node VSS through the resistor R2, a back gate terminal connected to the source, and a gate connected to a gate of the PMOS transistor 13. In other words, the PMOS transistor 31 forms a current mirror with the PMOS transistor 13. Further, monitor current Im whose current value is substantially the same as that of the current Ic is output from the drain of the PMOS transistor 31. The amplifier 32 has an output terminal connected to the back gate terminal of the input transistor 11. Further, a non-inverting terminal of the amplifier 32 receives the input voltage VC as the reference voltage, and an inverting terminal thereof is connected to a connecting point (hereinafter referred to as node N1) of the drain of the PMOS transistor 31 and the resistor R2. Note that the resistor R2 in the present embodiment has the same resistance value as that of the resistor R1.

The control voltage generator 30 generates the monitor voltage Vm at the node N1 by a product of the monitor current Im and the resistance value of the resistor R2. In other words, the control voltage generator 30 detects the current amount of the current Ic. Then the control voltage generator 30 generates the control voltage Vcnt based on the difference between the monitor voltage Vm and the input voltage VC. At this time, since the resistor R1 and the resistor R2 have the same resistance value, the monitor voltage Vm has the same value as that of the source voltage of the input transistor 11.

When the current value of the current Ic flowing in the input transistor 11 is small with respect to the input voltage VC, the monitor voltage Vm is lower than the input voltage VC in the control voltage generator 30. The control voltage generator 30 increases the control voltage Vcnt according to the difference between the input voltage VC and the monitor voltage Vm. Accordingly, the threshold value voltage Vt of the input transistor 11 decreases, and the current amount of the current Ic with respect to the magnitude of the input voltage VC increases. On the other hand, when the current value of the current Ic flowing in the input transistor 11 is larger than the input voltage VC, the monitor voltage Vm is higher than the input voltage VC in the control voltage generator 30. The control voltage generator 30 decreases the control voltage Vcnt according to the difference between the input voltage VC and the monitor voltage Vm. Hence, the threshold value voltage Vt of the input transistor 11 increases and the current amount of the current Ic with respect to the magnitude of the input voltage VC decreases.

From the above description, the control voltage generator 30 detects the current amount of the current Ic generated at the input transistor 11, generates the monitor voltage Vm based on the detected current, and controls the control voltage Vcnt according to the difference between the monitor voltage Vm and the input voltage VC. Hence, the control voltage generator 30 is able to automatically adjust the control voltage Vcnt so that the relation between the input voltage and the current Ic becomes the predetermined one. By providing the control voltage generator 30, the voltage controlled oscillator 2 according to the second embodiment is able to set the control current Is as appropriate without performing the simulation at the design stage as well as in the voltage controlled oscillator 1 according to the first embodiment.

Third Embodiment

Figure 5:
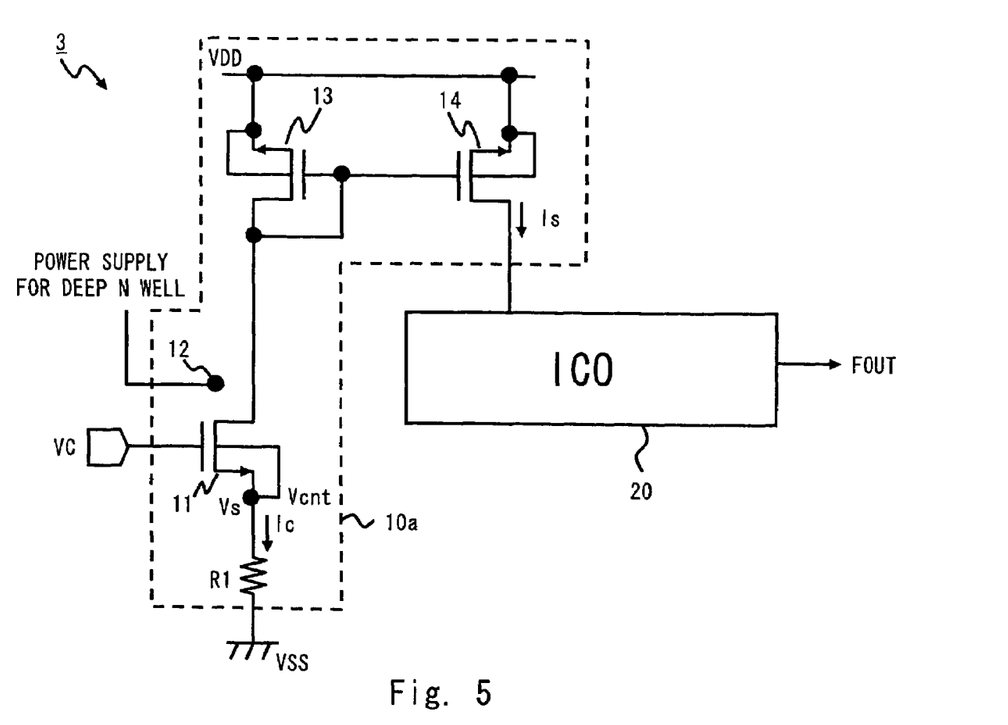
FIG. 5 is a schematic diagram of a voltage controlled oscillator according to a third embodiment.
Figure 6:
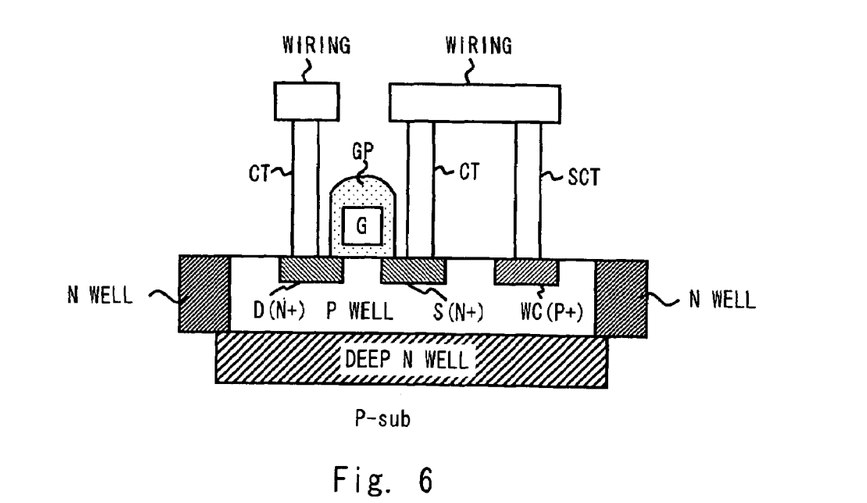
FIG. 6 is a cross sectional view of an input transistor according to the third embodiment.

FIG. 5 shows a schematic diagram of a voltage controlled oscillator 3 according to the third embodiment. In the voltage-current converter 10 of the voltage controlled oscillator 1 according to the first embodiment, the control voltage Vcnt generated at the voltage source 15 is applied to the back gate of the input transistor 11. On the other hand, in the voltage-current converter 10a of the voltage controlled oscillator 3, the source voltage Vs of the input transistor 11 is used as the control voltage Vcnt. FIG. 6 shows a cross sectional view of the input transistor 11 of the voltage-current converter 10a. As shown in FIG. 6, in the input transistor 11 according to the present embodiment, the source S and the well contact WC are connected by a wiring.

Figure 7:
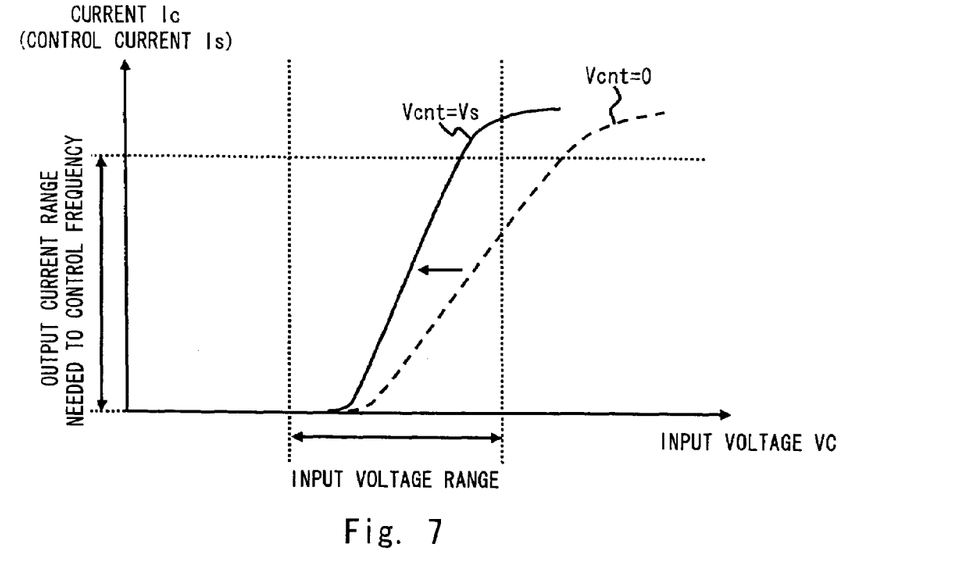
FIG. 7 is a graph showing a voltage-current characteristics of a voltage-current converter according to the third embodiment.

Now, FIG. 7 shows a voltage-current characteristics of the voltage-current converter 10a. As shown in FIG. 7, when the control voltage Vcnt is fixed to the ground voltage, the input voltage VC needs to be fluctuated in a range wider than the input voltage range in order to secure the output current range needed to control the frequency by the control current Is. On the contrary, when the source voltage Vs is used as the control voltage Vcnt, the variance of the control current Is with respect to the input voltage VC is larger than a case where the control voltage Vcnt is fixed-to the ground voltage. In summary, it is possible to vary the control current Is in the voltage-current converter 10a in a wide range even with the narrow range of the input voltage.

This is because the voltage generated at the resistor R1 increases and the source voltage Vs increases when the current Ic increases according to the increase of the input voltage VC, so that the control voltage Vcnt input to the back gate terminal of the input transistor 11 increases and the threshold value voltage Vt of the input transistor 11 decreases. Accordingly, it is possible to output larger amount of current Ic with respect to the voltage value of the input voltage VC as the input voltage VC increases in the voltage-current converter 10a.

From the above description, in the third embodiment, it is possible to make the variance rate of the current Ic with respect to the input voltage VC of the input transistor 11 larger than in the first and second embodiments.

Accordingly, it is possible for the voltage-current converter 10a according to the third embodiment to secure wider range of output voltage in the input voltage range narrower than the voltage-current converter 10 of the first and second embodiments. Further, since wide output voltage range can be secured in the narrow input voltage range, it is possible to control the output voltage range of the control current Is to obtain the output voltage range needed to control the frequency in the input voltage range even when the variation of the threshold value voltage of the resistance R1 and the input transistor 11 is caused.

Further, in the voltage-current converter 10a according to the third embodiment, it is possible to correct the variance rate of the control current Is with respect to the input voltage VC according to the resistance value of the resistor R1. For example, when the resistance value of the resistor R1 decreases due to the variation, the current amount of the current Ic with respect to the input voltage VC increases. On the other hand, since the source voltage Vs decreases and thus the control voltage Vcnt decreases as well, the threshold value voltage Vt of the input transistor 11 increases. Therefore, the driving ability of the input transistor 11 decreases and the current Ic deceases. In summary, in the voltage-current converter 10a, when the resistance value of the resistor R1 decreases, the driving ability of the input transistor decreases and is corrected so that the current Ic increasing due to the variation of the resistor R1 decreases. On the other hand, when the resistance value of the resistor R1 increases, the driving ability of the input transistor is improved and is corrected so that the current Ic decreasing due to the variation of the resistor R1 increases. As stated above, in the voltage-current converter 10a according to the third embodiment, it is possible to correct the variation of the control current Is due to the variation of the resistance value of the resistor R1.

It is apparent that the present invention is not limited to the above embodiments, but may be modified and changed without departing from the scope and spirit of the invention. For example, although the voltage-current converters 10 and 10a include a current mirror formed by the PMOS transistors 13 and 14 in the above description, this current mirror can be omitted depending on the configurations of the current controlled oscillator 20. Further, the input transistor can also be formed by the PMOS transistor.

What is claimed is:

1. A voltage controlled oscillator controlling frequency of an output signal according to input voltage, the voltage controlled oscillator comprising:
    a current controlled oscillator setting the frequency of the output signal based on control current; and
    a voltage-current converter including a transistor controlling a current amount of the control current according to the input voltage, wherein
    the voltage-current converter is supplied with control voltage, and threshold value voltage of the transistor is controlled according to the control voltage.

2. The voltage controlled oscillator according to claim 1, wherein the voltage-current converter further includes a current setting resistor having one end connected to a first power supply terminal and the other end connected to a source of the transistor.

3. The voltage controlled oscillator according to claim 1, wherein the transistor includes a well region supplied with the control voltage and a deep well region formed between the well region and a substrate region, the deep well region being formed by a semiconductor having a conductive type different from that of the substrate region.

4. The voltage controlled oscillator according to claim 1, wherein the control voltage is a predetermined voltage.

5. The voltage controlled oscillator according to claim 1, further comprising a control voltage generator generating the control voltage based on reference voltage and a current amount of the control current.

6. The voltage controlled oscillator according to claim 5, wherein the control voltage generator generates detection voltage according to the current amount of the control current and generates the control voltage based on voltage difference between the detection voltage and the reference voltage.

7. The voltage controlled oscillator according to claim 5, wherein the reference voltage is generated based on the input voltage.

8. The voltage controlled oscillator according to claim 6, wherein the reference voltage is generated based on the input voltage.

9. The voltage controlled oscillator according to claim 2, wherein the transistor includes the source and a back gate terminal connected to each other, and uses voltage generated in the source as the control voltage.

10. The voltage controlled oscillator according to claim 3, wherein the transistor includes a source and a back gate terminal connected to each other, and uses voltage generated in the source as the control voltage.

* * * * *